United States Patent
Yamazaki et al.

[11] Patent Number: 5,884,830
[45] Date of Patent: Mar. 23, 1999

[54] CAPILLARY FOR A WIRE BONDING APPARATUS

[75] Inventors: Nobuto Yamazaki, Kunitachi; Minoru Torihata; Tatsunari Mii, both of Musashimurayama, all of Japan

[73] Assignee: Kabushiki Kaisha Shinkawa, Tokyo, Japan

[21] Appl. No.: 915,821

[22] Filed: Aug. 21, 1997

[30] Foreign Application Priority Data

Aug. 21, 1996 [JP] Japan ................................ 8-238541

[51] Int. Cl.⁶ ............................ H01L 21/60; B23K 20/10
[52] U.S. Cl. ................................ 228/1.1; 228/4.5
[58] Field of Search ................................ 228/1.1, 4.5

[56] References Cited

U.S. PATENT DOCUMENTS 3,357,090 12/1967 Tiffany ...................... 228/1.1
4,974,767 12/1990 Alfaro et al. ................. 228/4.5

FOREIGN PATENT DOCUMENTS

| S57-87143 | 5/1982 | Japan . | |
| 59-191338 | 10/1984 | Japan | 228/4.5 |
| H1-26531 | 5/1989 | Japan . | |
| H1-42349 (U) | 12/1989 | Japan . | |
| H3-780 | 1/1991 | Japan . | |
| 4-69943 | 3/1992 | Japan | 228/1.1 |

*Primary Examiner*—Patrick Ryan
*Assistant Examiner*—Jeffrey T. Knapp
*Attorney, Agent, or Firm*—Koda & Androlia

[57] ABSTRACT

In a capillary used in a wire bonding apparatus that has a wire threading hole through which a bonding wire of 10 to 30 μm diameter passes and is provided with two chamfers, i.e., lower and upper chamfers, near the tip end of the wire threading hole, the upper chamfer has a chamfer angle of 3 to 19 degrees and a depth of 20 to 50 microns.

7 Claims, 2 Drawing Sheets

CAPILLARY FOR A WIRE BONDING APPARATUS

BACKGROUND OF THE INVENTION

1. Field of the Invention

The present invention relates to a capillary used in a wire bonding apparatus.

2. Prior Art

A typical wire bonding method in the process of manufacturing, for instance, semiconductor devices, includes the steps shown in FIGS. 4(a) through 4(g).

First, as shown in FIG. 4(a), a ball 3a is formed by a spark discharge created by an electric torch 5 on a wire 3 which extends from the lower end of a capillary 4, and then the electric torch 5 is moved in the direction shown by the arrow. Next, as shown in FIG. 4(b), the capillary is moved to a point above the first bonding point 1a; and then as shown in FIG. 4(c), the capillary 4 is lowered, the ball 3a on the tip end of the wire 3 is pressed against the first bonding point 1a, and an ultrasonic vibration is applied to the capillary 4 by a horn which has thereon the capillary 4 so as to bond the ball 3a to the first bonding point.

Afterward, as shown in FIG. 4(d), the capillary 4 is raised and as shown in FIG. 4(e) moved in the looping direction A so as to be positioned at a point above the second bonding point 2a. Next, as shown in FIG. 4(f), the capillary 4 is lowered, the wire 3 is pressed against the second bonding point 2a, and an ultrasonic vibration is applied to the capillary 4 by the horn so as to bond the wire 3 to the second bonding point 2a. Then, after the capillary 4 is raised to a given position, a damper 6 is closed, the capillary 4 and damper 6 are raised together, and the wire 3 is cut as shown in FIG. 4(g).

The connection of one wire is thus completed.

Japanese Patent Application Laid-Open (Kokai) No. S57-87143 and Japanese Patent Application Publication (Kokoku) No. H1-26531 disclose examples of the wire bonding methods described above.

The capillary 4 described above is taught by, for instance, Japanese Utility Model Application Publication (Kokoku) No. H1-42349 and Japanese Patent Application Publication (Kokoku) No. H3-780. The details of the structure of a capillary of this type is described in FIG. 3.

In FIG. 3, two chamfers, i.e., lower and upper chamfers 11 and 12, are formed near the tip end of a wire threading hole 10 of the capillary 4 through which a bonding wire passes. In FIG. 3, the reference numeral 13 referrs to a portion where the lower chamfer 11 is formed continuously to the upper chamfer 12; and in addition, HD indicates the diameter of the wire threading hole 10, T indicates the tip diameter of the capillary 4, $CD_1$ indicates the diameter of the lower chamfer 11, $\theta_1$ indicates the chamfer angle of the lower chamfer 11, $\theta_2$ indicates the chamfer angle of the upper chamfer 12, α indicates the face angle, and OR indicates the outer radius. When d is the diameter of a bonding wire 3, HD is d+(8 to 12) μm (microns); and $\theta_1$ is 80 to 100 degrees, and $\theta_2$ is 20 to 40 degrees.

In the prior art capillary 4 described above that has two chamfers, the lower and upper chamfers 11 and 12, when the ball 3a is bonded to the first bonding point 1a shown in FIG. 4, the excess portion of the ball flows toward the wire threading hole 10 through the upper chamfer 12 and wells up inside the capillary 4. As a result, the diameter of the press-bonded ball is reduced. However, pads on pellets are installed at finer pitches due to today's demand of higher integration of semiconductor IC chips; and as a result, both the diameter of the wire 3 and the size of the ball 3a are also required to be reduced. The prior art described above can be used in cases where the diameter d of the wire 3 is in the range of 20 to 80 μm; however, if the diameter d of the wire 3 is as small as in the range of 10 to 30 μm, various problems arise.

When the chamfer angle $\theta_2$ of the upper chamfer 12 is large, i. e., if it is in the range of 20 to 40 degrees, then it is likely that the amount of ball material which wells up into the capillary 4 (i.e. the amount of ball material that enters the inside of the capillary 4) during press-bonding of the ball increases. As a result, the amount of ball material that is crushed and press-bonded by the lower chamfer decreases, and the pressing force during press-bonding of the ball to the first bonding point 1a by the capillary 4 decreases, resulting in a drop in the bonding force. Furthermore, since material of the ball 3a enters the wire threading hole 10 of the capillary 4, friction is caused when the capillary is raised; and this results in a force which causes peeling of the press-bonded ball bonded to the first bonding point and further a force which reduces the press-bonding force.

SUMMARY OF THE INVENTION

Accordingly, the object of the present invention is to provide a capillary that can produce a higher, improved ball bonding force for a bonding wire that has a diameter in the range of 10 to 30 μm (microns).

The first means of the present invention which accomplishes the object is characterized in that in a capillary for use in a wire bonding apparatus in which two chamfers, i.e., lower and upper chamfers, are formed in the tip end of the wire threading hole, the upper chamfer is formed with an angle of 3 to 19 degrees and a height of 20 to 50 μm.

The second means of the present invention which accomplishes the object is characterized in that in the above-described first means, the diameter of the wire threading hole widens upward from the upper end of the upper chamfer, so that the diameter of the lower end of the wire threading hole is defined as a hole diameter of the wire threading hole, the hole diameter being defined as the smallest diameter portion of the wire threading hole.

BRIEF DESCRIPTION OF THE DRAWINGS

FIGS. 4(a) through 4(g) show the steps of a current wire bonding method.

DETAILED DESCRIPTION OF THE INVENTION

Figure 3:
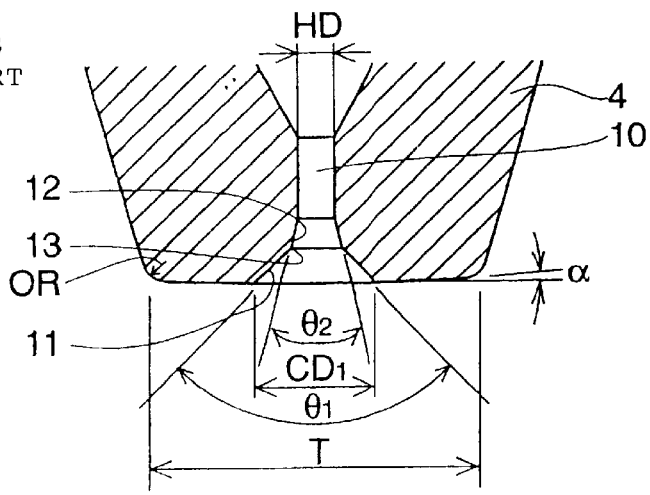
FIG. 3 is a sectional view of a conventional capillary.

A first embodiment of the present invention will be described with reference to FIG. 1. Elements which are the same as in FIG. 3 or which correspond to the parts in FIG. 3 are labeled with the same symbols.

Figure 1:
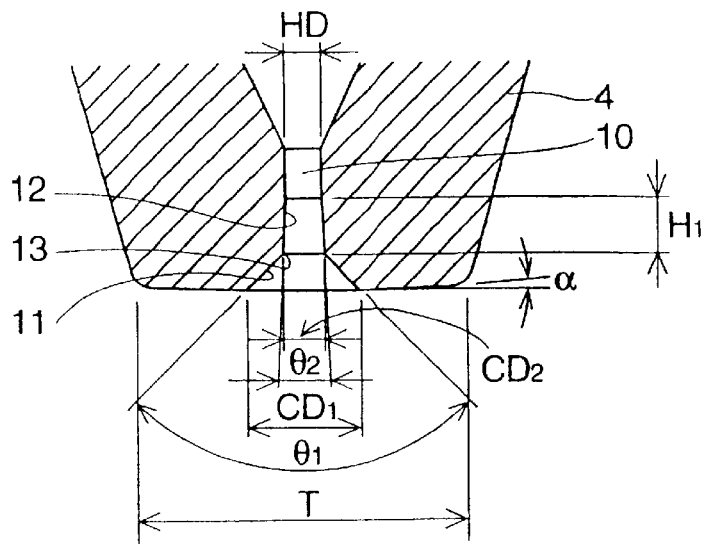
FIG. 1 is a sectional view of one embodiment of the capillary according to the present invention.

In the embodiment of FIG. 1, the capillary 4 includes a wire threading hole 10 which is provided therein with an upper chamfer portion 12 and a lower chamfer portion 11. The upper and lower chamfer portion 12 and 11 are continuously formed so that a wire having a diameter of 10 to 30 μm (microns) passes therethrough. The upper chamfer 12 is formed with a chamfer angle $\theta_2$ of 3 to 19 degrees and has a height or depth $H_1$ of 20 to 50 µm. The chamfer angle $\theta_1$ of the lower chamfer 11 is 80 to 100 degrees which is the same as in a conventional capillary 4 µm.

Figure 4:
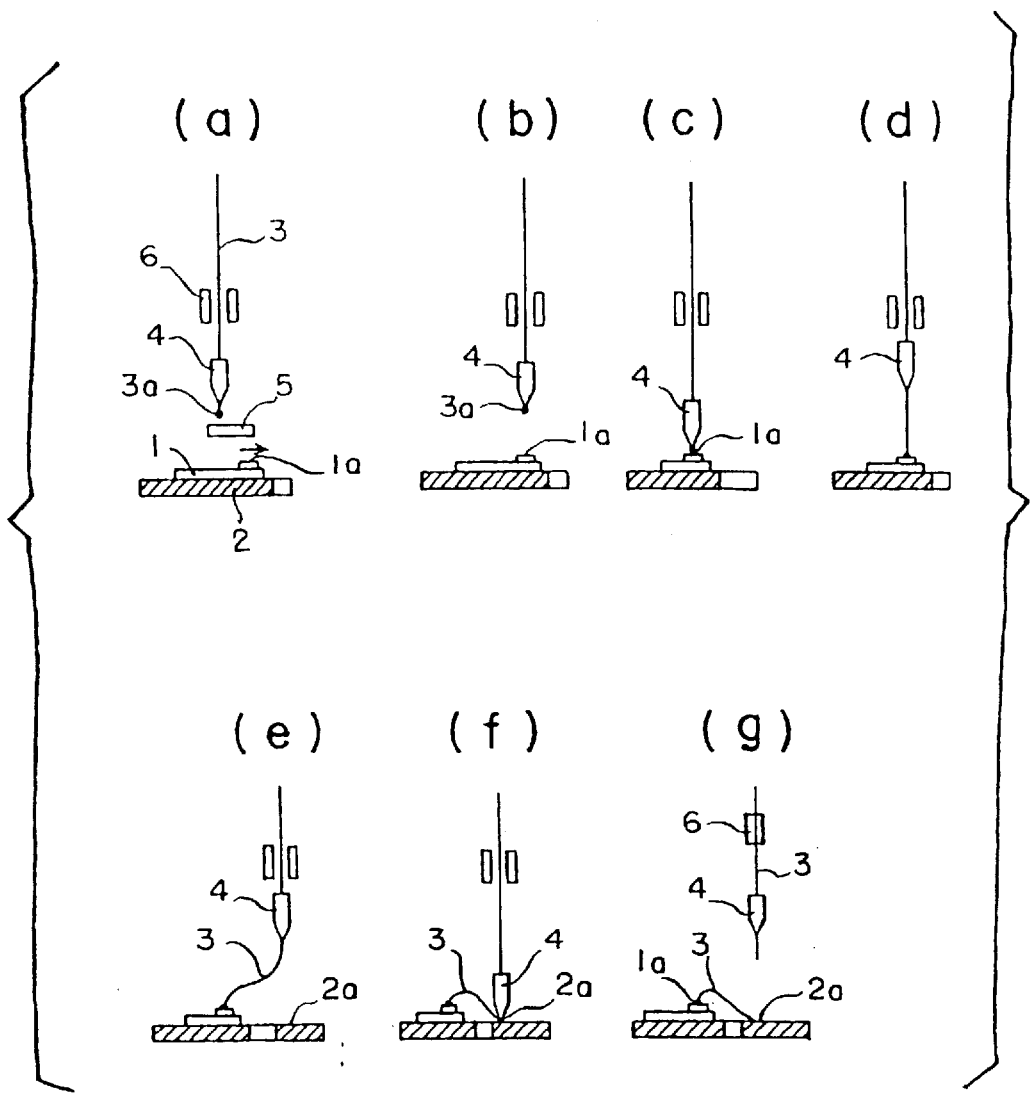
FIG. 4 including

Thus, since the chamfer angle $\theta_2$ of the upper chamfer 12 is small, i.e., 3 to 19 degrees, the amount of ball material that flows into the area of the upper chamfer 12 is limited and reduced (compared to the prior art capillary having the upper chamfer diameter of 20 to 40 degrees). Furthermore, even if a slight amount of ball material should flow into the area of the upper chamfer 12, the amount of this material which has flown thereinto can be compensated by the upper chamfer 12 that has a height $H_1$ of 20 to 50 µm (compared to the height of less than 20 µm of the prior art upper chamfer), so that the ball material is prevented from flowing into the wire threading hole 10. In other words, since a greater amount of ball material remains and is deformed in the lower chamfer 11 than in the upper chamfer 12, the pressing force during the press-bonding of the ball to the first bonding point 1$a$ (see FIG. 4) by the capillary 4 is high, and the increased and improved bonding force is obtained. Furthermore, since the ball material is prevented from flowing into the wire threading hole 10, the amount of friction that would be generated during the step of moving up the capillary 4 is reduced, and the press-bonded ball that is bonded to the first bonding point 1a is prevented from peeling.

Figure 2:
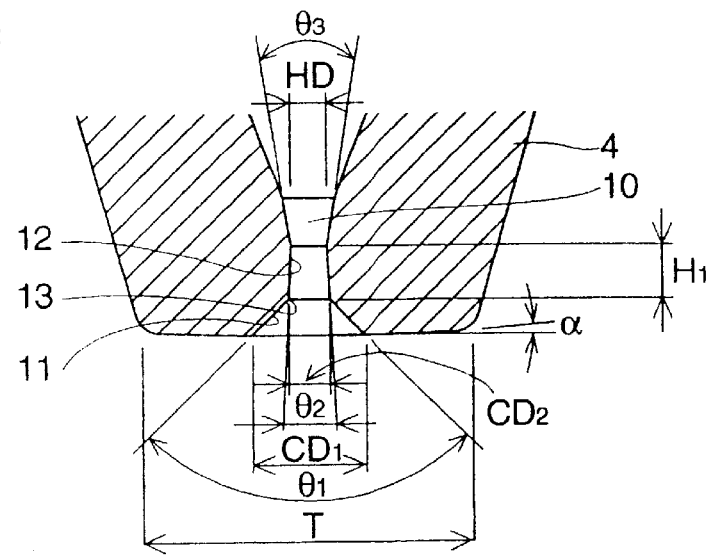
FIG. 2 is a sectional view of another embodiment of the capillary according to the present invention.

FIG. 2 illustrates another embodiment of the present invention. In this embodiment, the inside of wire threading hole 10 is taper-shaped so that the inner circumferential surface thereof is inclined and not parallel to its axis and the wire threading hole 10 widens in diameter upward from the top end of the upper chamfer 12. The lower end of the wire threading hole 10, which is continuous to the top end of the upper chamfer 12, has a hole diameter HD of d+(8 to 12) 82 m. With the wire threading hole 10 thus formed so as to have an inclined surface therein, the surface area of the wire that contacts the capillary 4 is reduced; accordingly, the frictional force applied to the wire is small, and favorable results are obtainable. In this case, there are no particular restrictions on the inclined surface angle $\theta_3$ of the wire threading hole 10 that widens upward. However, if this angle $\theta_3$ is too large, the lower end of the wire threading hole 10 that has a hole diameter HD makes a sharper edge with reference to the upper chamfer 12, which is undesirable. Favorable results are obtainable in cases where the angle $\theta_3$ is in the range of 2 to 60 degrees.

In the respective embodiments described above, the hole diameter HD can be the same as in a conventional device; however, the experiments show that favorable results are obtainable when the hole diameter HD is set at a value which exceeds the wire diameter d by no more than 3 to 8 µm; in other words, preferable results are obtained when the hole diameter HD, which is the smalles diameter portion of the wire threadinghole, is set so as to be equal to d+(3 to 8) µm, in which d is the diameter of the used bonding wire as described above.

As seen from the above, the present invention is characterized by the fact that in a capillary for use in a wire bonding apparatus in which two chamfers, i.e., lower and upper chamfers, are formed near the tip end of the wire threading hole, the upper chamfer is formed with a chamfer angle of 3 to 19 degrees and has a height of 20 to 50 µm. Accordingly, the capillary can produce an improved ball bonding force in cases when a wire having a diameter of 10 to 30 µm is used in the bonding.

We claim:

1. A capillary for a wire bonding apparatus provided therein with a wire threading hole, said wire threading hole having an upper chamfer portion and a lower chamfer portion which is formed on a tip end of said wire threading hole, wherein said upper chamfer has a chamfer angle of 3 to 19 degrees.

2. A capillary for a wire bonding apparatus according to claim 1, wherein said upper chamfer portion has an axial length of 20 to 50 microns and a portion of said wire threading hole located above said upper chamfer portion widens in a direction opposite to said upper chamfer portion.

3. A capillary for a wire bonding apparatus, a wire threading hole of said capillary having therein two chamfers comprising lower and upper chamfers, which are formed near the tip end of said wire threading, so that a wire having a diameter of 10 to 30 microns passes therethrough, said capillary being characterized in that said upper chamfer is formed with a chamfer angle of 3 to 19 degrees and a height of 20 to 50 microns.

4. A capillary for a wire bonding apparatus according to claim 1, wherein said wire threading hole has a diameter which exceeds a diameter of said wire by no more than 3 to 8 microns.

5. A capillary for a wire bonding apparatus, a wire threading hole of said capillary having therein two chamfers comprising lower and upper chamfers, which are formed near the tip end of said wire threading hole, so that a wire having a diameter of 10 to 30 microns passes therethrough, said capillary being characterized in that said upper chamfer is formed with a chamfer angle of 3 to 19 degrees and a height of 20 to 50 microns, and said wire threading hole has an inclined inner circumferential surface so that said wire threading hole widens in a direction opposite to a top end of said upper chamfer and a diameter of said wire threading hole is defined at a lower end thereof.

6. A capillary for a wire bonding apparatus according to claim 2, wherein said wire threading hole has a diameter which exceeds a diameter of said wire by no more than 3 to 8 microns.

7. A capillary for a wire bonding apparatus according to claim 2, wherein said wire threading hole widens upward an angle of 2 to 60 degrees.

\* \* \* \* \*

UNITED STATES PATENT AND TRADEMARK OFFICE
CERTIFICATE OF CORRECTION

PATENT NO. : 5,884,830
DATED : March 23, 1999
INVENTOR(S) : Nobuto Yamazaki, et al.

It is certified that error appears in the above-indentified patent and that said Letters Patent is hereby corrected as shown below:

In claim 4, line 2, change "claim 1" to --claim 3--.

In claim 6, line 2, change "claim 2" to --claim 5--.

In claim 7, line 2, change "claim 2" to --claim 5--.

Signed and Sealed this

Tenth Day of October, 2000

Attest:

Q. TODD DICKINSON

*Attesting Officer*         *Director of Patents and Trademarks*